United States Patent [19]
Letavic et al.

[11] Patent Number: 5,986,331
[45] Date of Patent: Nov. 16, 1999

[54] MICROWAVE MONOLITHIC INTEGRATED CIRCUIT WITH COPLANER WAVEGUIDE HAVING SILICON-ON-INSULATOR COMPOSITE SUBSTRATE

[75] Inventors: Theodore James Letavic, Putnam Valley; Manjin Jerome Kim, Hartsdale, both of N.Y.

[73] Assignee: Philips Electronics North America Corp., New York, N.Y.

[21] Appl. No.: 08/655,170

[22] Filed: May 30, 1996

[51] Int. Cl.⁶ .................................................... G02B 5/18
[52] U.S. Cl. .......................... 257/664; 257/347; 257/501; 257/604; 257/624; 257/625; 257/659; 257/728; 333/208; 333/239
[58] Field of Search ................................ 257/275, 604, 257/624, 625, 659, 728, 664, 347, 501; 333/161, 164, 333, 246, 248, 239, 282, 208

[56] References Cited

U.S. PATENT DOCUMENTS

| | | | |
|---|---|---|---|
| 4,847,568 | 7/1989 | Hasagewa et al. | 330/250 |
| 5,014,018 | 5/1991 | Rodwell et al. | 333/20 |
| 5,267,020 | 11/1993 | Marsland et al. | 257/368 |
| 5,449,953 | 9/1995 | Mathanson et al. | 257/728 |
| 5,481,232 | 1/1996 | Wu et al. | 333/246 |
| 5,559,912 | 9/1996 | Agahi et al. | 385/42 |
| 5,604,360 | 2/1997 | Zhang et al. | 257/347 |
| 5,625,729 | 4/1997 | Brown | 385/31 |

FOREIGN PATENT DOCUMENTS

| | | | |
|---|---|---|---|
| 0195520B1 | 9/1986 | European Pat. Off. | H01L 23/48 |
| 60-124851 | 7/1985 | Japan | H01L 23/12 |

OTHER PUBLICATIONS

SOI–based devices: status overview. Nishimura et al, Solid state Technology, 94, p. 90, 1994.
Electronics Engineers Handbook, McGraw Hill Book Co., 3d ed., p. 105, Fig. 8–161, 1989.
Properties of Microstrip Line on Si–SiO$_2$ System, Hasegawa et al, IEEE Trans. On MIT, vol. MIT–19, No. 11, Nov. 11, 1971.
Propagation characteristics of MIS Transmission Lines with Inhomogeneous Doping Profile, Wu et al, IEEE Trans. on MIT, vol. 38, No. 12, Dec. 1990.

*Primary Examiner*—Fetsum Abraham
*Attorney, Agent, or Firm*—Leroy Eason

[57] ABSTRACT

A microwave monolithic integrated circuit includes a coplanar waveguide (CPW) formed by a composite silicon structure constituted by a relatively high resistivity substrate, a first oxide layer on the upper surface thereof, a relatively thin silicon layer formed on the surface of the first oxide layer, and a very thin second oxide layer formed on the surface of the thin silicon layer. The silicon layer and the first oxide layer on which it is formed constitutes a silicon-on-insulator or SOI structure. A metallic signal line and ground planes are bonded to the surface of the second oxide layer. The zone of the thin silicon layer which extends between the ground planes is doped with an active impurity to produce high conductivity therein. As a result, the electric component of a quasi-TEM wave traversing the waveguide is substantially restricted to the thin silicon layer and does not penetrate to the underlying bulk silicon substrate. This achieves significantly reduced transmission loss and a quality factor Q in the vicinity of 17 for the CPW. Passive and active circuits may be formed in regions of the thin silicon layer other than those used for the CPW.

4 Claims, 2 Drawing Sheets

MICROWAVE MONOLITHIC INTEGRATED CIRCUIT WITH COPLANER WAVEGUIDE HAVING SILICON-ON-INSULATOR COMPOSITE SUBSTRATE

BACKGROUND OF THE INVENTION

1. Field of the Invention

The invention relates to the field of microwave monolithic integrated circuits (MMICs) for wireless applications, such as cellular radio and personal communication systems. More particularly, it relates to MMICs which include passive circuit elements and active amplifier stages which are coupled together by microwave transmission line in order to achieve reduced propagation loss of microwave signals conveyed there-between.

2. Description of the Related Art

In an MMIC passive circuit elements such as resistors, inductors and capacitors are fabricated in monolithic form on a silicon substrate. Active amplifier stages are also fabricated in the monolithic structure, and are coupled to the passive elements by microwave transmission line. This has commonly taken the form of a microstrip line, which consists of a conducting strip on the upper surface of a silicon dioxide dielectric layer and a metal ground plane on the back surface. An MMIC structure of this kind is shown, for example, in FIG. 8-161 on page 105 of the text Electronics Engineers Handbook, McGraw Hill Book Co., 3d ed. 1989.

A major problem with such a structure is that the electric field component of a quasi-TEM electromagnetic wave must couple to the ground plane through the entire substrate, resulting in high propagation losses. This problem is avoided by providing a ground plane on the same surface of the silicon die as the conducting strip, resulting in a coplanar waveguide (CPW) structure. This type of waveguide is also shown in the aforesaid FIG. 8-161 of the cited textbook. The small spatial separation between the conducting strip and the ground plane effectively confines the electric field to the near-surface of the substrate, reducing the depth of penetration into the body of the substrate. The transmission loss, which is the inverse of the quality factor Q, is then dependent on the conductivity and consequently the doping level of the near-surface region of the substrate. By heavily doping to achieve a high conductivity the transmission loss can be reduced, increasing the quality factor Q. However, it is time-consuming and expensive to produce a heavily doped silicon substrate body.

The technical paper "Properties of Microstrip Line on Si—SiO$_2$ System" by Hasegawa et al, IEEE Trans. On MTT, Vol. MIT-19, No. 11, Nov. 11, 1971, describes a microstrip transmission line having a layer of SiO$_2$ on a moderately doped silicon substrate. Under some conditions, this achieves a "slow-wave" mode of propagation, having reduced transmission loss. However, this structure does not lend itself to monolithic fabrication with other circuit elements and still has higher transmission loss than is desirable. The technical paper "Propagation Characteristics of MIS Transmission Lines with Inhomogeneous Doping Profile" by Wu et al, IEEE Trans. on MTT, Vol. 38, No. 12, December 1990, describes a coplanar waveguide having an inhomogeneously doped silicon substrate, and achieves relatively low transmission loss. However, the inhomogeneous doping must extend through the entire thickness of the bulk silicon substrate, which is very difficult to achieve in practice.

BRIEF DESCRIPTION OF THE INVENTION

The invention provides an MMIC which includes a coplanar waveguide (CPW) having a signal conductor and ground planes on the upper surface of a composite silicon structure consisting a monocrystalline silicon substrate, a first oxide layer formed on the upper surface of the substrate, a relatively thin monocrystalline silicon layer formed on the surface of the first oxide layer, and a thinner second oxide layer formed as a dielectric on the surface of the thin silicon layer, the upper surface of the dielectric oxide layer being the upper surface of the composite structure. The structure can be referred to as silicon-on-insulator, or SOI, the insulator being the first oxide layer. The region of the thin silicon layer underlying the signal conductor and extending between the ground planes is implanted with an active dopant, generally N-type, which is then thermally diffused so as to form a zone of high conductivity therein. In a preferred embodiment, the doping is performed so that the diffused zone has a lateral gradient of decreasing concentration in a direction from the signal conductor to each of the ground planes. However, doping variations ranging from abrupt to linear can easily be obtained.

The high conductivity of the diffused zone causes the electric field of a quasi-TEM wave to separate from the magnetic field and bend upward toward the upper dielectric layer, with minimal penetration of the underlying silicon substrate. This effect is enhanced even further when the diffused zone has a doping gradient as described. A quality factor Q of approximately 15 has been attained, many times that achieved with a homogeneously doped silicon substrate body. The isolation of the electric wave from the substrate obviates the need for deep diffusion of the substrate, enabling choice of a substrate resistivity which minimizes radiation loss due to penetration by the magnetic component of the quasi-TEM wave. Active and passive circuit elements can be formed by conventional oxide masking and diffusion techniques in the silicon layer of the SIO structure, in regions thereof which are not used to form the CPW.

BRIEF DESCRIPTION OF THE DRAWINGS

The invention will now be described in further detail with reference to the accompanying drawings, wherein.

DESCRIPTION OF THE PREFERRED EMBODIMENTS

Figure 1:
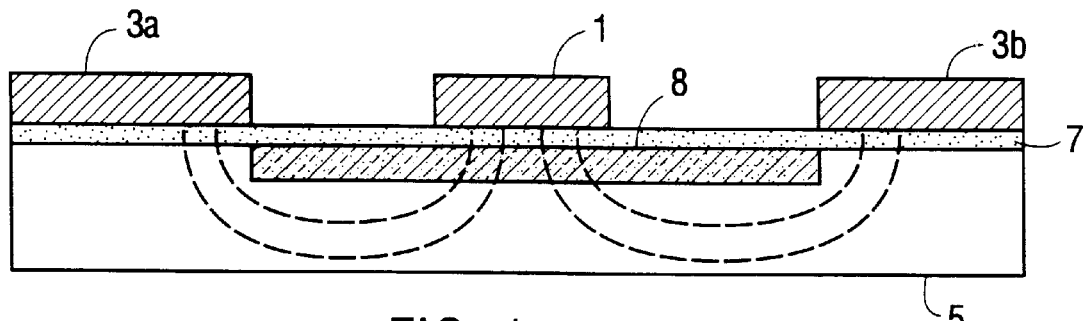
FIG. 1 is a cross-sectional view of a prior art form of coplanar waveguide (CPW) transmission line having a bulk silicon substrate, showing how the electric field lines of transmitted microwave deeply penetrate the substrate.

Referring to FIG. 1, there is shown the structure of a prior art form of coplanar waveguide (CPW) consisting of a metal conductor 1 and a pair of metal ground planes 3$a$ and 3$b$ extending parallel thereto on either side thereof to provide ground return potential for the electric component of a quasi-TEM wave traversing along the length of the CPW. These elements are on the upper surface of a silicon substrate 5, which surface has been oxidized to form a thin layer 7 of $SiO_2$ which serves as a dielectric to insulate the ground planes front the conductor 1. The region of the upper surface of substrate 5 which laterally extends between the two ground planes is doped, by implantation and diffusion, with an active impurity (e.g., antimony, arsenic, phosphorous or boron), in order to form a zone 8 of high conductivity. If all of the field lines of the electric component of the quasi-TEM wave remained within the doped zone 8, that would indeed result in low transmission loss. In fact, however, there is substantial field penetration of the substrate body 5 and so transmission loss by attenuation therein. To reduce that loss would require deep doping through the entire substrate, which is time-consuming and expensive and would excessively slow the speed of propagation of the wave.

Figure 2:
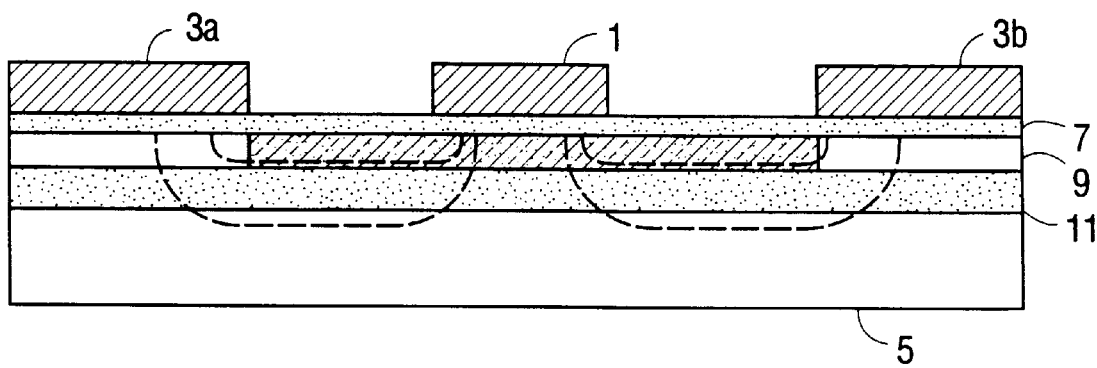
FIG. 2 is a cross-sectional view of a coplanar waveguide having an SOI structure and a homogenously doped zone in the silicon layer of that structure.

Applicant has taken a different approach to the problem of reducing transmission loss in a CPW, by providing a structure as shown in FIG. 2. Therein there is provided between the silicon substrate 5 and the surface oxide layer 7 a layer 9 of relatively high resistivity monocrystalline silicon on an oxide layer 11. Thus, there is a silicon-on-insulator structure consisting of silicon layer 9 on oxide layer 11, supported on substrate 5. A zone of the silicon layer a, extending between the ground planes 3a and 3b, is doped to obtain a high conductivity therein. The substrate may typically be $500\mu$ thick, the oxide layer 11 $40\mu$ thick, and the silicon layer 9 only $10\mu$ thick. It is therefore a simple matter to dope a zone of the layer 9 sufficiently to obtain high conductivity therein. The electric field lines, as shown in FIG. 2 by the dashed lines, are now largely confined within the layer 9 but there is nevertheless some degree of fringing into substrate 5. Accordingly, while the structure of FIG. 2 provides significantly lower transmission loss than that in FIG. 1 there is still room for improvement.

Applicant has found that if the doping of the silicon layer 9 provides a concentration gradient, the dopant concentration being reduced as the region underlying the ground planes is approached, that will cause the electric field lines of a quasi-TEM wave to bend upward above the oxide layer 11, thereby almost entirely eliminating penetration of the substrate 5. This is shown in FIG. 3, wherein the shading lines in layer 9 are spaced further apart in approaching the regions under the ground planes 3a and 3b, signifying decreased dopant concentration and consequently increased resistivity.

Figure 3:
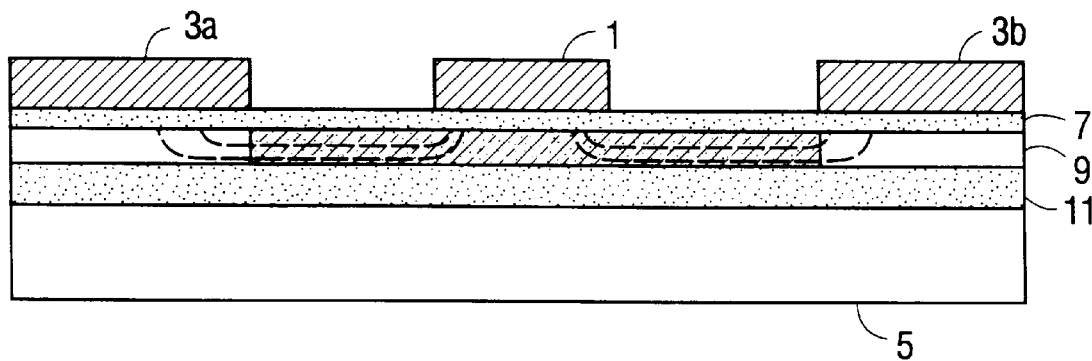
FIG. 3 a cross-sectional view of a coplanar waveguide having a SOI structure and a lateral diffusion gradient in the doped zone in the silicon layer of that structure.
Figure 4:
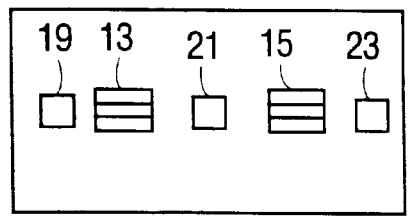
FIG. 4 is a plan view of an MMIC in accordance with the invention, which includes a CPW as shown in FIG. 3 as well as various passive circuit elements and active amplifier stages.

FIG. 4 is a plan view of an MMIC in accordance with the invention, which incorporates two coplanar waveguides 13 and 15 of the kind shown in cross-section in FIG. 3. Both are formed in a monolithic integrated circuit chip 17 which also has formed therein a passive circuit element 19 such as a resistor, capacitor or inductor, an active amplifier stage 21 comprising a transistor, and a further passive circuit element 23. The actual connections between the CPWs and the circuit elements are conventional, and are omitted for clarity. The CPW 13 couples element 19 to the input of amplifier 21, and CPW 15 couples the output of amplifier 21 to the circuit element 23. The passive circuit elements and amplifier stage are all formed by conventional implantation and diffusion methods in the silicon layer 9 of an SOI structure comprising that layer and an underlying oxide layer 11 as shown in FIG. 3. The diffused zone formed in layer 9 in FIG. 3 is, of course, only provided where a CPW is to be formed.

Figure 5:
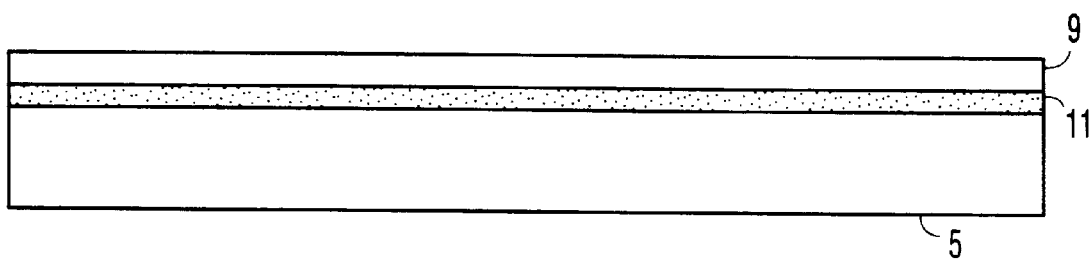
FIGS. 5–6 are successive steps of a method for fabricating the CPW shown in FIG. 3.
Figure 6:
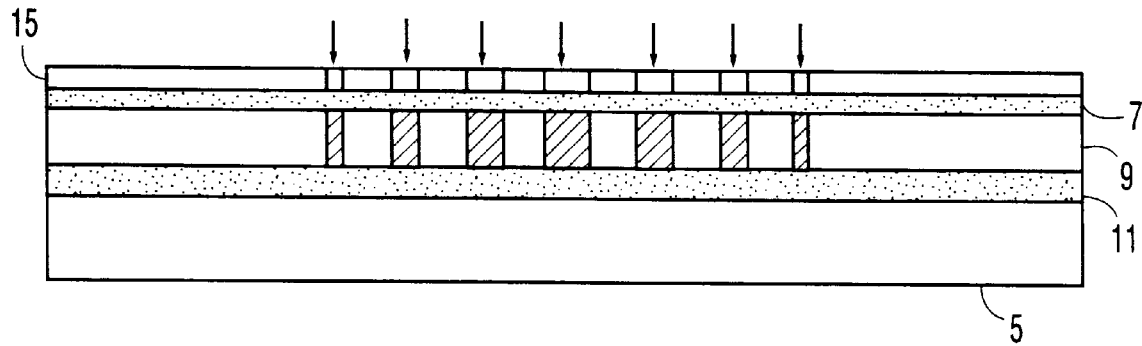

The CPW shown in FIG. 3 may be formed by a process as shown in FIGS. 5–6. FIG. 5 shows in cross-section an SOI structure formed on a silicon substrate 5 of relatively high resistivity. The substrate may typically be $500\mu$ thick, and the oxide layer 11 formed thereon may be $2\mu$ thick. The actual thickness can, however, range from $0.02\mu$ to $1000\mu$ depending on the impedance which is desired for the particular application. The relatively thin monocrystalline silicon layer 9 is then formed on oxide layer 11. A method of achieving that is to bond layer 9 to the oxide layer by heating in an inert ambient atmosphere.

As shown in FIG. 6, the next step is to grow a thin oxide layer 7 on the surface of silicon layer 9, to serve as a pad oxide for controlled doping by implanting a selected impurity, typically N type, through a mask 15 having implantation windows therein for achieving a desired lateral concentration gradient. Any desired gradient can be achieved by size control of the implantation windows, a larger window size being allocated for higher concentration and the size being gradually decreased towards the lowest concentration. The resulting implanted regions are shown cross-hatched in FIG. 6. The structure is then heated to produce lateral diffusion, for example at a temperature of 1100° C. for 24 hours. The ground planes and conducting line are then bonded to oxide layer 7, resulting in the final structure shown in FIG. 3. However, the diffusion mask and the thermal cycle can be selected so as to result, as noted above, in a doping variation ranging from abrupt to linear.

It should be understood that the term "upper surface" has been used herein purely to identify one of two opposed surfaces of a relevant layer of the MMIC. Obviously, the entire structure can be used in any spatial orientation, so that the "upper surface" might in fact be facing downwardly.

While the invention has been described with reference to preferred embodiments thereof, it will be apparent to those skilled in the art that various modifications and adaptations may be made without departing from the essential spirit and scope of the invention as set forth in the ensuing claims.

What is claimed is:

1. A microwave monolithic integrated circuit (MMIC) which includes a coplanar waveguide (CPW) for microwave radio frequency signals, said CPW having a signal conductor and a pair of ground planes spaced therefrom on either side thereof and extending substantially parallel to each other on the upper surface of a composite silicon-on-insulator (SOI) structure; said SOI structure comprising:

a monocrystalline silicon substrate having an upper surface which is oxidized to provide thereon an insulating layer of silicon dioxide;

a layer of monocrystalline silicon of relatively low conductivity formed on said insulating layer and having an upper surface which is oxidized to provide thereon a thin layer of silicon dioxide which constitutes the upper surface of the SOI structure; and a diffused zone of relatively high conductivity formed in said silicon layer, said zone laterally extending therein under said signal conductor and up to each of said ground planes;

whereby the electric component of a quasi-TEM microwave radio frequency signal traversing said CPW is bent upward into said silicon layer so as to reduce transmission loss due to penetration of said electric component into the silicon substrate.

2. An MMIC as claimed in claim 1 wherein said diffused zone is of graded conductivity in the lateral direction, being of highest conductivity underlying said signal conductor and of lowest conductivity upon reaching said ground planes.

3. A coplanar microwave radio frequency waveguide (CPW) having a signal conductor and a pair of ground planes spaced therefrom on either side thereof extending substantially parallel to each other on the upper surface of a composite silicon-on-insulator (SOI) structure; said SOI structure comprising:

a monocrystalline silicon substrate having an upper surface which is oxidized to provide thereon an insulating layer of silicon dioxide;

a layer of monocrystalline silicon of relatively low conductivity formed on said insulating layer and having an upper surface which is oxidized to provide thereon a thin layer of silicon dioxide which constitutes the upper surface of the SOI structure; and a diffused zone of relatively high conductivity formed in said silicon layer, said zone laterally extending therein under said signal conductor and up to each of said ground planes;

whereby the electric component of a quasi-TEM microwave radio frequency signal traversing said CPW is bent upward into said silicon layer so as to reduce transmission loss due to penetration of said electric component into the silicon substrate.

4. A CPW as claimed in claim 3 wherein said diffused zone is of graded conductivity in the lateral direction, being of highest conductivity underlying said signal conductor and of lowest conductivity upon reaching said ground planes.

* * * * *